United States Patent
Fujisawa et al.

(10) Patent No.: US 6,226,074 B1
(45) Date of Patent: May 1, 2001

(54) EXPOSURE MONITOR MASK, EXPOSURE ADJUSTING METHOD AND METHOD OF MANUFACTURING SEMICONDUCTOR DEVICES

(75) Inventors: Tadahito Fujisawa, Tokyo; Soichi Inoue, Yokohama; Hiroshi Nomura, Kawasaki; Ichiro Mori, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/510,244

(22) Filed: Feb. 22, 2000

(30) Foreign Application Priority Data

Feb. 22, 1999 (JP) .................................. 11-042732
Jun. 7, 1999 (JP) .................................. 11-158955

(51) Int. Cl.[7] .......................... G03B 27/42; G03B 27/32; G03F 9/00; G03C 5/00
(52) U.S. Cl. .................................. 355/53; 355/77; 430/5; 430/311
(58) Field of Search ................................ 3555/53, 67, 77; 430/5, 20, 22, 30, 311; 356/399–400

(56) References Cited

U.S. PATENT DOCUMENTS

| | | | |
|---|---|---|---|
| 4,055,376 | * 10/1977 | Daberko | 350/10 |
| 4,388,386 | * 6/1983 | King et al. | 430/5 |
| 4,774,461 | * 9/1988 | Matsui et al. | 324/158 R |
| 4,908,656 | * 3/1990 | Suwa et al. | 355/53 |
| 5,408,083 | * 4/1995 | Hirukawa et al. | 250/201.2 |
| 5,508,803 | * 4/1996 | Hibbs et al. | 356/243 |
| 5,721,607 | * 2/1998 | Ota | 355/53 |
| 5,776,645 | * 7/1998 | Barr et al. | 430/22 |
| 5,807,647 | * 9/1998 | Hashimoto | 430/5 |

FOREIGN PATENT DOCUMENTS 9-329889   12/1997   (JP) .

* cited by examiner

*Primary Examiner*—David M. Gray
*Assistant Examiner*—Hung Henry Nguyen
(74) *Attorney, Agent, or Firm*—Finnegan, Henderson, Farabow, Garrett & Dunner, L.L.P.

(57) ABSTRACT

An exposure monitor mask used with an exposure system for manufacturing ICs includes an exposure detecting pattern having at least three patterns arranged in one direction, the exposure detecting pattern including a pair of relative position detecting patterns with at least one variable intensity pattern that allows the intensity of light transmitted therethrough to vary monotonously in the one direction disposed between the pair of relative position detecting patterns.

15 Claims, 9 Drawing Sheets

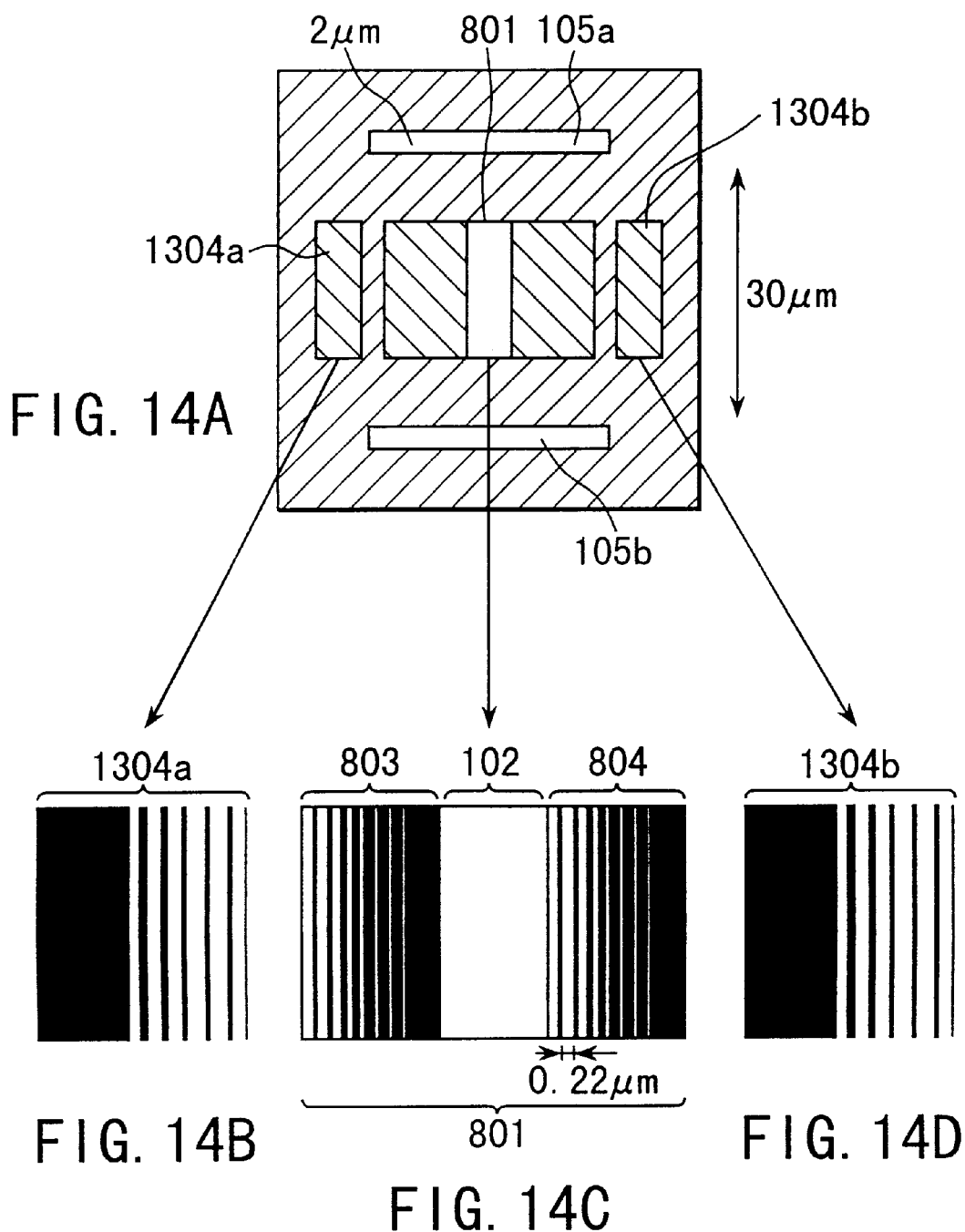

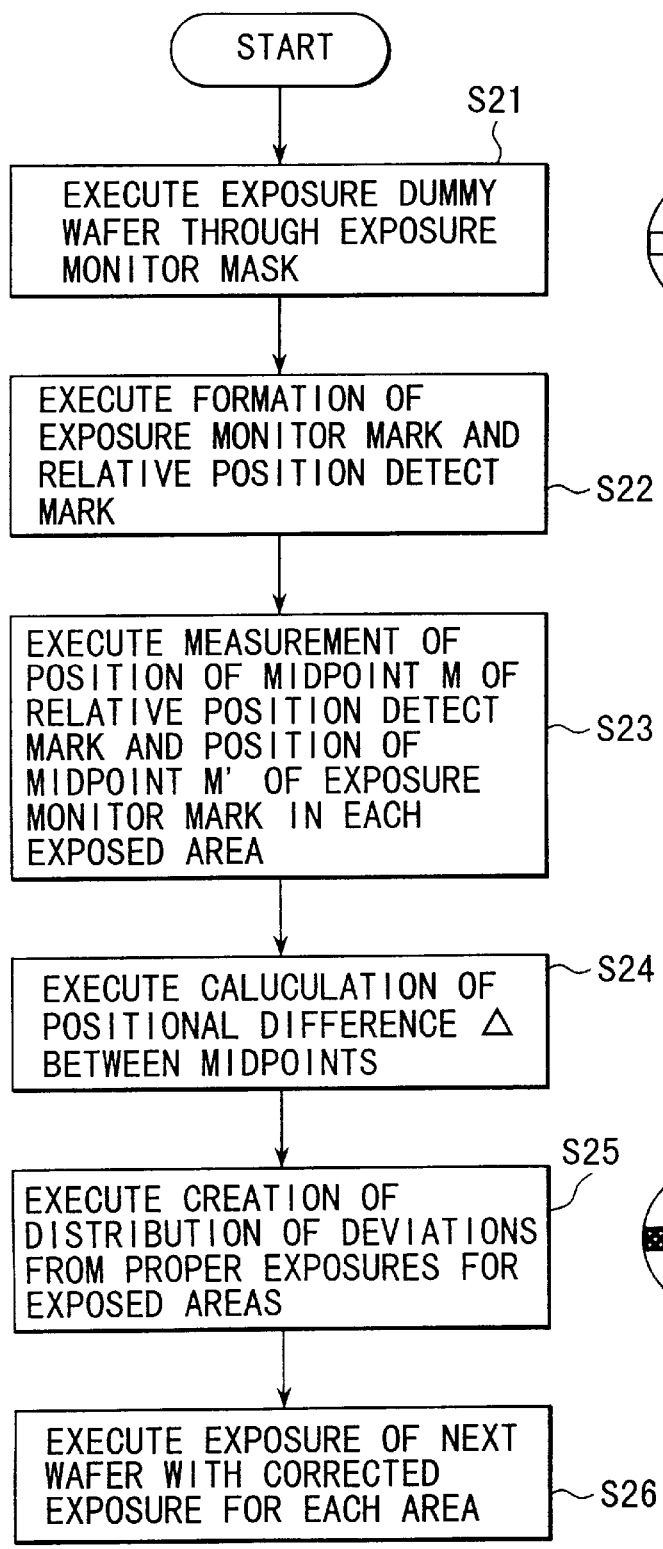
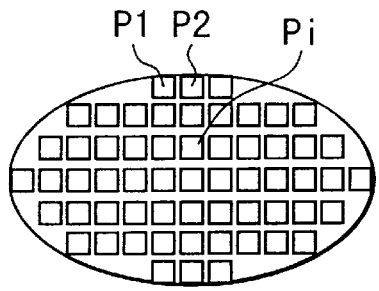
FIG. 16A
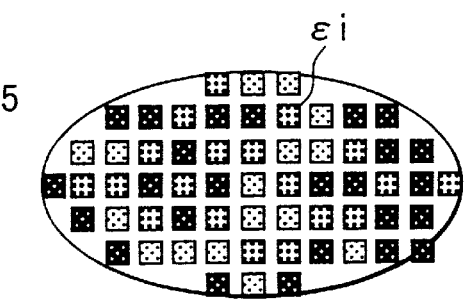
FIG. 16B
FIG. 15

EXPOSURE MONITOR MASK, EXPOSURE ADJUSTING METHOD AND METHOD OF MANUFACTURING SEMICONDUCTOR DEVICES

BACKGROUND OF THE INVENTION

The present invention relates to a lithographic technique applied for manufacturing semiconductor devices and more specifically to an exposure monitor mask which monitors with high speed and high accuracy an exposure setting value to achieve a maximum exposure margin and a method of exposure adjustment.

In the process of lithography in the manufacture of semiconductor devices or integrated circuits, apparatuses for making pattern exposure, called exposure equipment, have been used. There is a type of exposure equipment which is called as a reduced projection exposure equipment (stepper, or step and scan exposure system). With this stepper, light from a light source passes through a mask on which an exposure pattern is formed, then is reduced in size by an optical system and projected onto a semiconductor wafer.

In transferring circuit patterns on a mask onto the wafer, it has been required that the patterns capable of being transferred be made as fine as possible. From the optical image formation theory, as is well known, the resolution (linewidth) R and the depth of focus DOF are given by the following equations:

$$R = k_1 \lambda / NA \tag{1}$$

$$DOF = k_2 \lambda / NA^2 \tag{2}$$

where NA is the numerical aperture of the projection optical system, λ is the wavelength of the projected light, and k1 and k2 are process coefficients.

The above equations are referred to as Rayleigh's equations and have been employed as a measure of evaluation of the image formation performance of projection exposure equipment. To meet the fine patterning requirements, a shorter wavelength has been used for exposure and the numeral aperture of the projection lens has been increased and, at the same time, improvements have been made in process. However, the requirements for scaling down the dimensions of devices have become increasingly rigorous in recent years and it has become difficult to obtain sufficient margins of exposure and depth of focus, which has resulted in a reduction in yield. For this reason, in order to make effective use of a small exposure margin and prevent a reduction in yield, more accurate control for exposure and depth of focus has been demanded.

The control of exposure is usually performed based on measurements of the linewidth in a pattern. The pattern linewidth varies not only with exposure but also with the depth of focus. The finer the pattern, the less negligible the effect of focus errors on the pattern linewidth becomes. It is therefore difficult to determine whether variations in pattern linewidth are due to variations in exposure or variations in depth of focus, causing difficulties in controlling exposure with accuracy.

To solve these problems, there has been made a proposal for an exposure monitor mask having a pattern in which focus errors have no effect on the linewidth (see SPIE Vol. 1261 Integrated Circuit Metrology, Inspection, and Process Control IV (1990) p. 315). The feature of this proposal lies in forming on a wafer a monitor pattern having an exposure profile which does not depend on the focus state by using a mask pattern having a pitch that cannot be resolved by projection exposure equipment and progressively varying the dimensional ratio (the duty ratio) between adjacent light transmitting and blocking portions in the pattern.

In FIG. 19, there is illustrated an example of a monitor pattern based on linewidth measurement. In this figure, P denotes the pattern pitch having a measure under the critical resolution, 1401 denotes light blocking portions, and 1402 denotes light transmitting portions. The monitor pattern is arranged such that the width of the light transmitting portions increases in each direction away from the pattern center with the pattern pitch fixed.

In FIG. 20, there is illustrated the image intensity distribution on that line of the wafer which corresponds to the A–A' portion of the monitor pattern shown in FIG. 19 as the result of transfer of the monitor pattern. Since only zero-order diffracted light diffracted by the monitor pattern is directed onto the wafer, the image intensity varies in proportion to the square of the area of the light transmissive portion of the monitor pattern of FIG. 19. It is expected that, by transferring the mask pattern onto a resist while changing exposure in steps, measuring resulting linewidths on the resist by a linewidth measurement instrument, and calibrating the exposures and the linewidths, it will be possible to monitor exposure with high accuracy using the linewidth measuring instrument.

However, although the linewidth values obtained by measurements are reliable in terms of relative comparison, they have little reliability as absolute values. Therefore, the determination of exposure using the linewidth values themselves as a criterion of the exposure leads to a problem of reliability of exposure.

BRIEF SUMMARY OF THE INVENTION

It is an object of the present invention to provide an exposure monitor mask and an exposure adjustment method enabling the exposure to be adjusted with high accuracy with no need of linewidth measurement.

According to an aspect of the present invention, there is provided an exposure monitor mask comprising an exposure detecting pattern having at least three patterns arranged in one direction, the exposure detecting pattern including at least one variable intensity pattern that allows the intensity of exposing light transmitted therethrough to vary monotonously in the one direction.

According to another aspect of the invention, there is provided a method of exposure adjustment comprising the steps of: exposing a resist formed on the top of a substrate using an exposure monitor mask comprising an exposure detecting pattern having at least three patterns arranged in one direction, the exposure detecting pattern including at least one variable intensity pattern that allows the intensity of exposing light transmitted therethrough to vary monotonously in the one direction and thereby transferring the exposure detecting pattern onto the resist; developing the resist to thereby form marks corresponding to the exposure detecting pattern on the resist; measuring the position of a point M midway between two reference marks other than a mark corresponding to the variable intensity pattern and the position of a point M' midway between two edges of the mark corresponding to the variable intensity pattern which are opposed to each other in the one direction; calculating the difference Δ in position between the points M and M'; and adjusting an exposure value at which the resist on the substrate is to be exposed according to the calculated difference.

According to still another aspect of the present invention, there is provided a method of manufacturing semiconductor devices comprising the steps of: through the use of an exposure monitor mask comprising an exposure detecting pattern having at least three patterns arranged in one direction, the exposure detecting pattern including at least one variable intensity pattern that allows the intensity of exposing light transmitted therethrough to vary monotonously in the one direction, exposing each of areas on the surface of a dummy wafer on which a resist is formed in sequence under a given exposure condition and thereby transferring the patterns of the exposure monitor mask onto the resist; developing the resist to thereby form marks corresponding to the patterns of the exposure monitor mask on each of the exposed areas on the dummy wafer; measuring a difference in relative position between the marks for each of the exposed areas; calculating a deviation from a proper exposure for each of the exposed areas on the basis of measurements in the measuring step; and, in transferring a device pattern onto areas on the surface of a new wafer, exposing each of the areas in sequence at an exposure value obtained by correcting the exposure condition by the deviation from a proper exposure for the corresponding area on the dummy wafer.

The semiconductor manufacturing method may be preferably carried out in the following ways:

(a) The step of calculating a deviation from a proper exposure includes previously determining a relationship of mark displacement versus deviation from proper exposure from the results of exposure operations performed using the exposure monitor mask while changing the exposure condition and calculating a deviation from a proper exposure from the relationship.

(b) The method further includes the step of calculating a distribution of deviations from a proper exposure over the entire surface of the wafer after the step of calculating a deviation from the proper exposure for each of exposed areas, and the step of transferring a device pattern includes exposing each of areas on the new wafer at an exposure value obtained by correcting the given exposure condition in accordance with the distribution of deviations from the proper exposure.

The present invention may be preferably practiced in the following forms:

(a) Where the exposure monitor mask is used with an exposing system in which the wavelength of exposing light is $\lambda$, the numerical aperture on the photosensitive substrate side is NA and the coherent factor is $\sigma$, the variable intensity pattern is such that sets of a light transmissive portion and a light blocking portion are arranged discretely or progressively in the one direction at a pitch P that satisfies the following condition:

$$1/P \leq (1+\sigma)NA/\lambda.$$

(b) The exposure detecting pattern includes a pair of relative position detect patterns arranged in the one direction and in which the variable intensity pattern is interposed between the pair of relative position detect patterns.

(c) The exposure detecting pattern includes a pair of relative position detect patterns arranged in the one direction and in which a plurality of variable intensity patterns are interposed in the one direction between the pair of relative position detect patterns.

(d) The exposure detecting pattern includes a pair of displacement detect patterns arranged in a direction perpendicular to the one direction with the variable intensity pattern interposed therebetween and having a point midway therebetween substantially in the same position as a point midway between those edges of the exposure monitor pattern which are opposed to each other in the direction perpendicular to the one direction.

The present invention provides the following advantages:

Because an edge position of the variable intensity pattern shifts on the resist as the exposure varies, a change in exposure can be detected as a displacement between the relative position of the midpoint M of the two reference marks and the midpoint M' of the variable intensity pattern of the exposure detecting pattern, thus allowing a variation from proper exposure to be monitored with high speed and high accuracy through the use of a misalignment overlay inspection equipment.

Because the effect of a displacement of focus from its proper position on a proper exposure can be eliminated, a deviation from proper exposure can be monitored with higher accuracy.

By determining a deviation from proper exposure through the use of the exposure monitor mask and correcting the exposure condition of an exposing system by the deviation, the exposure value set in the exposure system can be adjusted with high accuracy.

In the semiconductor device manufacturing method, by previously determining deviations from proper exposures for exposed areas on a wafer under a given exposure condition through the use of the exposure monitor mask according to the present invention, subsequent wafers can be exposed at a corrected exposure for each of areas, thereby achieving the maximum of exposure margin and limiting a reduction in yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 14A is a plan view of a further variable intensity pattern formed in the exposure detecting pattern of the present invention;

FIG. 14B is a plan view of a relative position detect pattern in the exposure detecting pattern shown in FIG. 14A;

FIG. 14C is a plan view of an exposure monitor pattern in the exposure detecting pattern shown in FIG. 14A;

FIG. 14D is a plan view of another relative position detect pattern in the exposure detecting pattern shown in FIG. 14A;

FIG. 15 is a flowchart for use in explanation of a semiconductor device manufacturing method according to a third embodiment of the present invention;

FIG. 16A shows a dummy wafer to which the exposure is performed through an exposure monitor mask;

FIG. 16B shows a distribution of deviations from a proper exposure in the wafer obtained by the use of the calibration curve shown in FIG. 7;

DETAILED DESCRIPTION OF THE INVENTION

[First Embodiment]

A first embodiment of the present invention is directed to a simple exposure monitor mask which permits the function of misalignment overlay inspection equipment be utilized as it is and permits exposure be controlled with high speed and high accuracy. The inventors have conceived to monitor deviations from a proper exposure in view of the fact that the relative amounts of displacement between patterns can be detected with a sufficient sensitivity and measured values are highly reliable.

Figure 1:
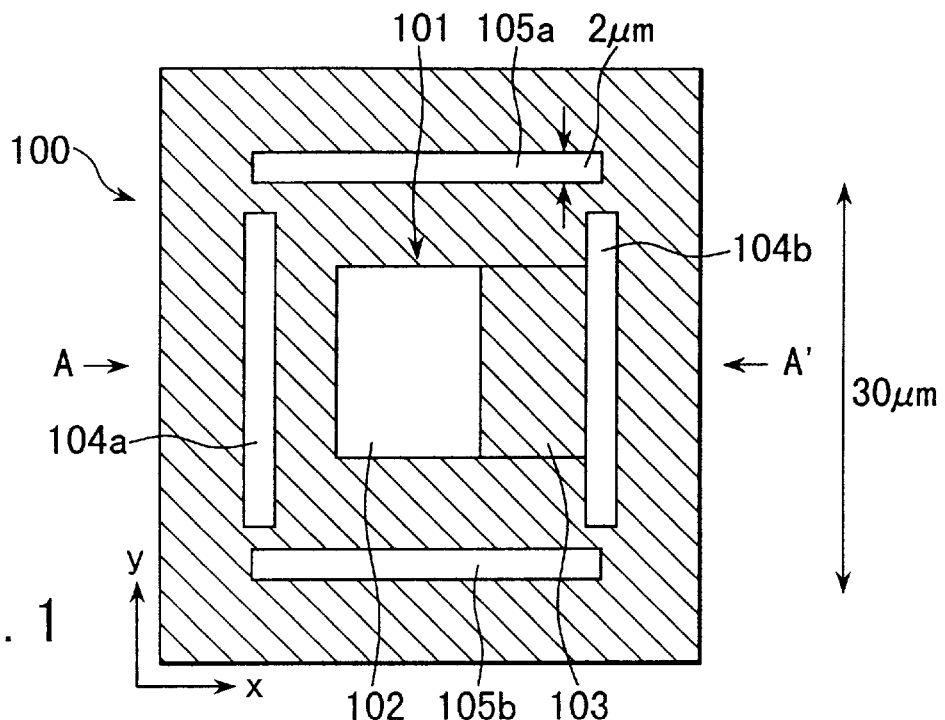
FIG. 1 is a schematic plan view of an exposure detecting pattern formed in an exposure monitor mask according to a first embodiment of the present invention.

FIG. 1 is a schematic plan view of an exposure detecting pattern formed in an exposure monitor mask according to the first embodiment of the present invention.

The exposure detecting pattern, indicated collectively at 100 in FIG. 1, is formed with a pair of relative position detecting patterns 104a and 104b and an exposure monitoring pattern 101 interposed between the paired relative position detecting patterns, those patterns 104a, 104b and 101 being arranged along one direction (x-axis direction). A pair of y-axis direction displacement detecting patterns 105a and 105b are further formed so that the exposure monitoring pattern 101 are interposed therebetween in the y-axis direction perpendicular to the x-axis direction.

The exposure monitor pattern 101 is formed of an aperture pattern 102 and a variable intensity pattern 103 adapted to allow the intensity of light transmitted therethrough to vary monotonously in the x-axis direction. The patterns 102 and 103 are arranged in the x-axis direction.

Figure 2:
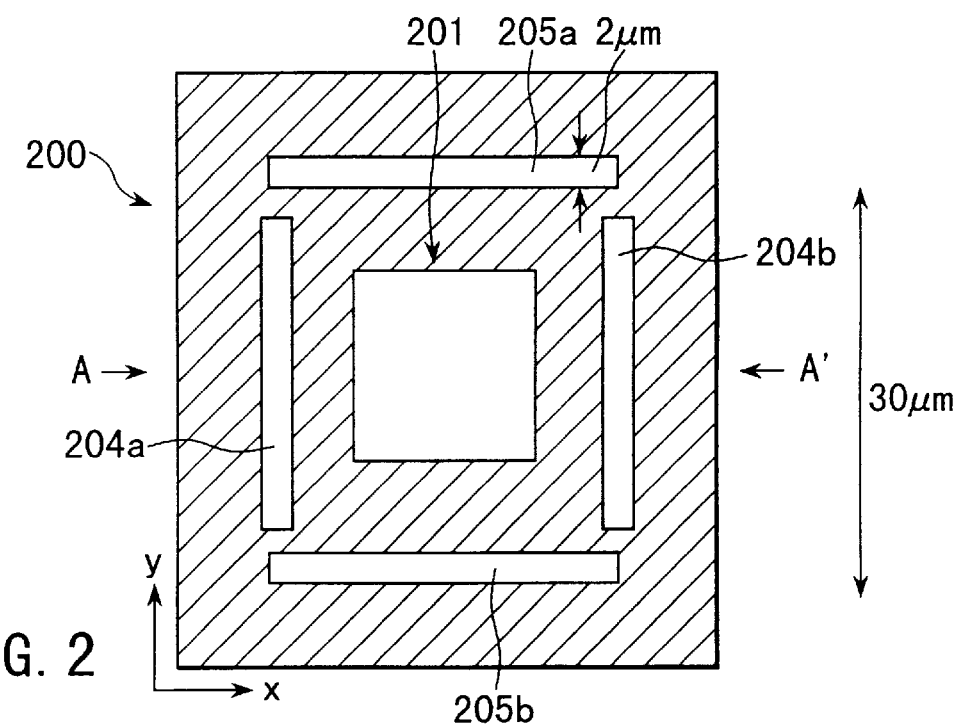
FIG. 2 is a plan view of a calibration pattern formed in the exposure monitor mask of the first embodiment.

The exposure monitor mask is further provided with a calibration pattern in which the relative amount of displacement is set to zero unlike the exposure detecting pattern shown in FIG. 1, because no intensity variable pattern is provided therein. FIG. 2 shows a calibration pattern 200 used with the exposure monitor pattern 100 according to the first embodiment of the present invention. As shown, the calibration pattern, indicated collectively by a reference numeral 200, comprises two pairs of relative position detect patterns, 204a and 204b; and 205a and 205b, and an aperture 201 interposed between the paired patterns 204a and 204b and between the paired patterns 205a and 205b.

Figure 3:
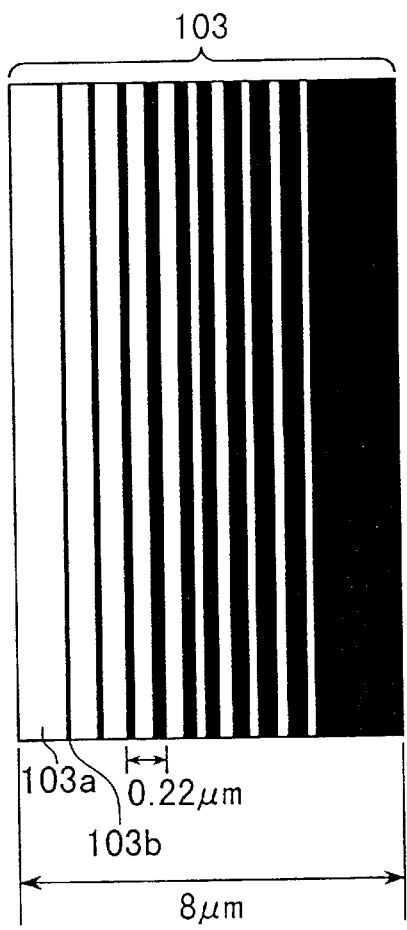
FIG. 3 is a schematic plan view of the variable intensity pattern formed in the exposure detecting pattern of FIG. 1.

In FIG. 3, there is illustrated the arrangement of the variable intensity pattern 103 in the exposure detecting pattern 100. The inventors have noticed that the pitch P (on-wafer dimension) of the variable intensity pattern that is not affected by the focus state is simply determined so as to satisfy the condition in which only the zero-order diffraction image is formed, i.e., $$1/P \geq (1+\sigma)NA/\lambda \tag{3}$$

where λ=exposing light wavelength, NA=numerical aperture, and σ=coherent factor. A continuous distribution of focus-independent light intensities from zero to unity was realized on top of a wafer (exposed substrate) by setting the pitch P (on wafer) to 0.22 μm below the resolution limit in accordance with expression (3) to conform to exposure equipment used (wavelength=248 nm, NA=0.6, σ=0.75) and arranging light transmissive portions 103a and light blocking portions 103b in the variable intensity pattern 103 so that the light transmissive portions are incremented in width by 6.25 nm.

The exposure detecting pattern 100 is designed such that a point midway between the paired y-axis direction displacement detect patterns 105a and 105b and a point midway between the edges of the aperture pattern 102 that are opposed to each other in the y-axis direction coincide with each other, allowing the amount of displacement in the y-axis direction to be measured. Setting, at the time of exposure, the displacement of the relative position of a point midway between the edges of the exposure monitor pattern 101 and the midpoint on a line connecting the paired displacement detect patterns 104a, 104b to within ±0.1 μm allows for a high-accuracy alignment.

Figure 4:
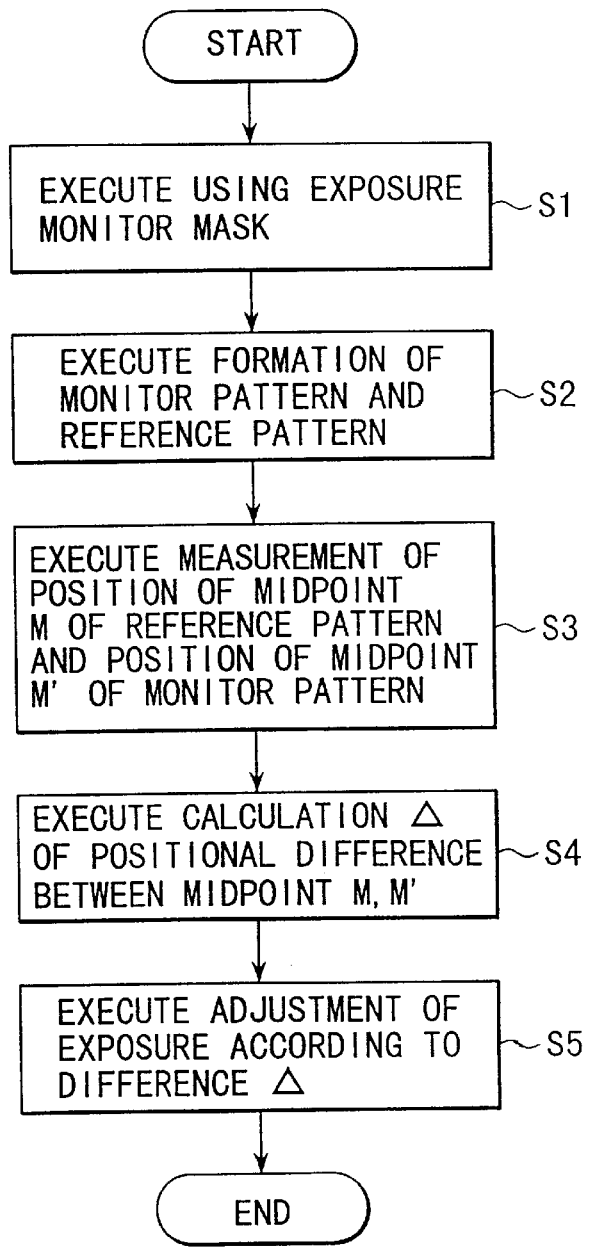
FIG. 4 is a flowchart for explaining the exposure determination method in the first embodiment.

Next, the method of determining an exposure using the exposure monitor mask will be described with reference to FIGS. 5 and 6 together with a flowchart of FIG. 4. First, a resist coated on top of a wafer is exposed using an exposure detecting pattern 100 formed in the exposure monitor mask, so that the exposure detecting pattern formed on the mask is transferred to the resist (step S1).

Figure 5:
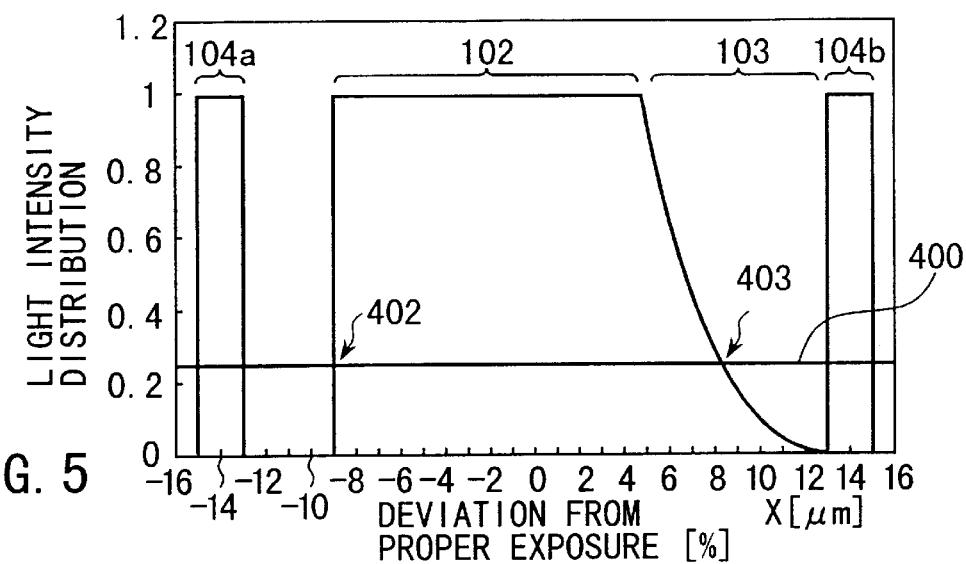
FIG. 5 shows the light intensity distribution on a portion of a resist corresponding to the A–A' portion of the exposure detecting pattern shown in FIG. 1.

FIG. 5 shows a distribution of light intensity on that portion of the resist that corresponds to the A–A' portion of the pattern 100. Normally, the exposure is adjusted to a minimum-rule pattern having the smallest margin. For example, when a 0.15 μm-rule pattern is transferred with a KrF exposure system, the light intensity corresponding to the proper exposure value (the edge light intensity indicated at 400 in FIG. 5) is of the order of 0.2 to 0.3. In FIG. 5, 104a, 102, 103 and 104b indicate the positions of the corresponding patterns formed on the mask. Further, in FIG. 5, 402 indicates the point at which the intensity of exposing light transmitted through the aperture pattern 102 agrees with the proper exposure value 400 and 403 indicates the point at which the intensity of exposing light transmitted through the variable intensity pattern 103 agrees with the proper exposure value indicated by the reference numeral 400.

After exposure, the resist is developed, so that the resist patterns including a monitor pattern and a relative position detecting pattern corresponding to the exposure detecting pattern 100 is formed on the wafer (step S2). FIG. 6 shows the sectional view of the resultant resist patterns corresponding to the A–A' portion of the mask pattern shown in FIG. 1.

Figure 6:
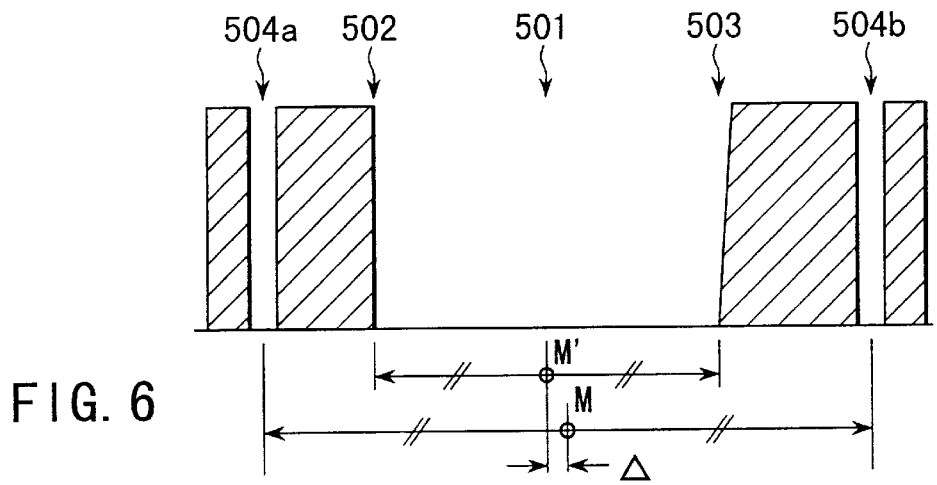
FIG. 6 shows a resist pattern section corresponding to the A–A' portion of FIG. 1.

In FIG. 6, 501 denotes an exposure monitor mark formed to correspond to the exposure monitor pattern 101, 502 and 503 denote edge positions of the exposure monitor mark 501 formed to correspond to the aperture pattern 102 and the variable intensity pattern 103, and 504a and 504b denote relative position detecting marks formed to correspond to the relative position detect patterns 104a and 104b.

A variation in proper exposure value appears as a variation (up and down) in the edge light intensity denoted by the line 400 so that the edge formation position 403 corresponding to the cross point between the variable intensity pattern 103 and the line 400 shifts. Thus, the edge 503 of the exposure monitor mark shifts accordingly with respect to the another edge 502. While, the positions of the respective relative position detect marks 504a and 504b do not change with exposure value and thus remain fixed.

Consequently, as can be seen from FIG. 6, a deviation from a proper exposure can be detected by means of misalignment overlay inspection equipment as a displacement in the x-axis direction of the relative position of the center point M' midway between two edges 502 and 503 of the exposure monitor mark 501 and the center point M midway between the relative position detecting marks 504a and 504b.

That is, the position M of the point midway between the two relative position detecting marks 504a and 504b and the position M' of the point midway between the two edges 502 and 503 of the exposure monitor mark 501 that are opposed to each other in the x-axis direction are measured (step S3).

The displacement Δ of the relative position of the two midpoints M and M', i.e., the difference in x-axis direction position between the two midpoints M and M', is determined (step S4).

For exposure control using the exposure monitor mask of the present embodiment, an adjustment is made to the exposure on the basis of a previously formed calibration curve of relative position displacement Δ versus deviation from proper exposure (step S5).

Figure 7:
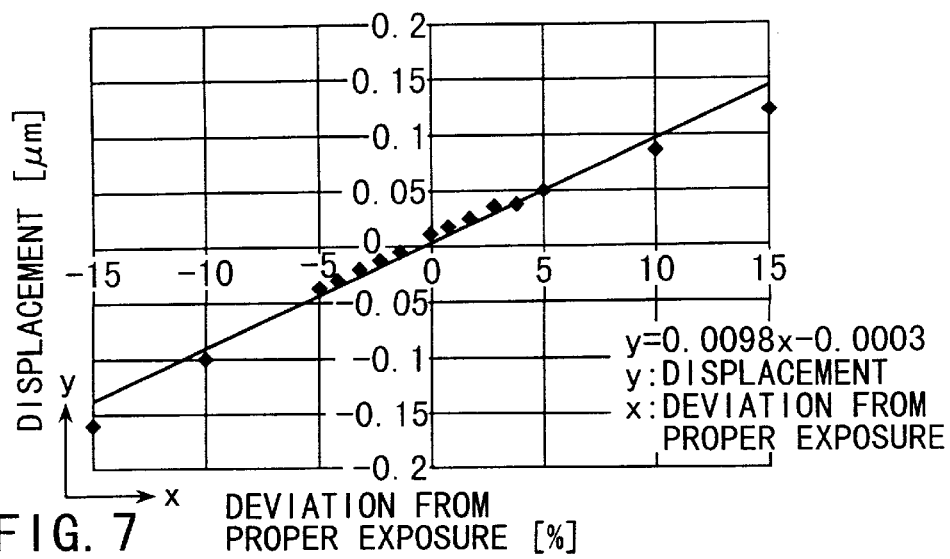
FIG. 7 shows a calibration curve obtained by using the exposure detecting pattern of FIG. 1.

FIG. 7 shows an example of such a calibration curve as obtained when the exposure detecting pattern 100 of FIG. 1 is used. The calibration curve (y=0.0098x−0.0003; y=displacement Δ of relative positions, x=deviations of a proper exposure) allows a deviation of a proper exposure to be known from a displacement Δ of the relative positions. Thus, the exposure value can be calibrated.

From the calibration curve shown in FIG. 7, the following relationship was obtained between the accuracy Sd of deviation from proper exposure and the accuracy Sp of detection of relative position displacement Δ:

$$Sd[\%]=102\times Sp[\mu m] \quad (4)$$

Misalignment overlay equipment used at this time has an accuracy of 5 nm (0.005 μm). An exposure monitor mask was therefore obtained which has an exposure detection sensitivity of the order of 0.5% as obtained from equation (4) and permits deviations from proper exposures be monitored with the above accuracy.

Figure 8:
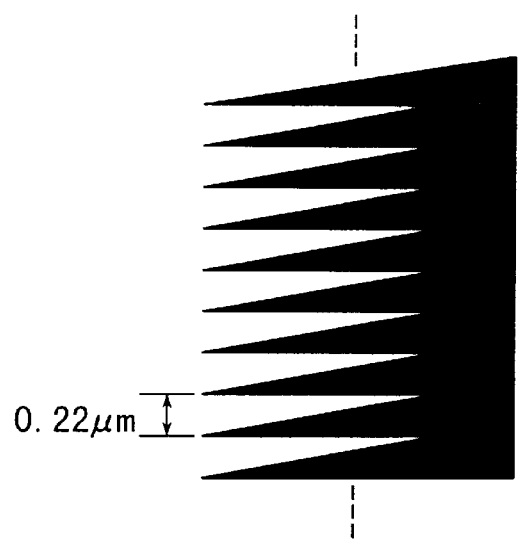
FIG. 8 is a schematic plan view of another variable intensity pattern applicable as the exposure detecting pattern.

The variable intensity pattern is not limited to that shown in FIG. 3. Any other intensity variable pattern may be used provided that it has light transmissive portions and light blocking portions arranged with their duty ratio changed discretely or continuously and at a pitch that cannot be resolved (under the resolution limit) under optical conditions of an exposure system used and allows a continuous distribution of the quantity of radiation on the surface of a wafer. An example of such a variable intensity pattern is shown in FIG. 8. In this pattern, the duty ratio of light transmissive and light blocking portions having a pattern size that cannot be resolved is varied continuously as shown in FIG. 8. The use of this pattern will provide the same advantages as with the pattern of FIG. 3.

Further, the exposure detecting pattern is not limited to that of FIG. 1. Use may be made of any other pattern that has marks that can be detected by misalignment overlay equipment. Merely making part of the marks a variable intensity pattern as described above will offer the same advantages as above.

[Second Embodiment]

A second embodiment of the present invention is directed to an exposure monitor mask which provides higher accuracy in exposure control than the exposure monitor mask of the first embodiment. To achieve higher detection sensitivity than in the first embodiment, a similar intensity variable pattern is also disposed at that side of the exposure monitor pattern 101 opposed to the variable intensity pattern 103 in FIG. 1.

Figure 9:
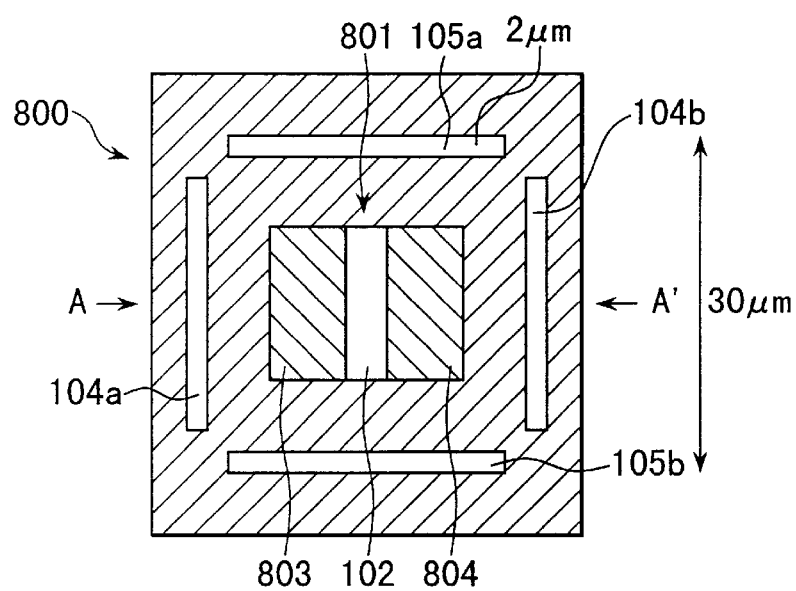
FIG. 9 is a plan view of an exposure detecting pattern used in an exposure monitor mask according to a second embodiment of the present invention.

FIG. 9 shows, in plan view, an arrangement of an exposure detecting pattern used with an exposure monitor mask according to the second embodiment of the present invention. In FIG. 9, like reference numerals are used to denote corresponding parts to those in FIG. 1 and detailed descriptions thereof are omitted. As in the first embodiment, the exposure monitor mask is also provided with the calibration pattern as shown in FIG. 2.

As shown in FIG. 9, an exposure monitor pattern 801 of an exposure detecting pattern 800 is formed with a variable intensity pattern 803, an aperture pattern 102, and a variable intensity pattern 804 which are arranged in the x-axis direction in the order mentioned.

Figure 10:
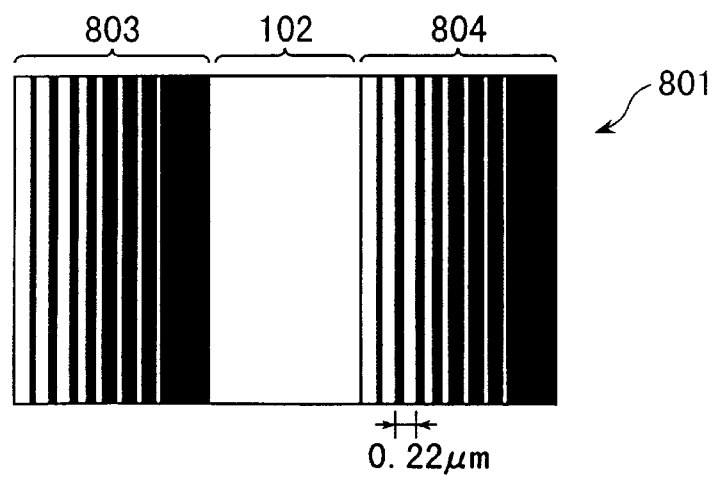
FIG. 10 is a schematic plan view of the variable intensity pattern formed in the exposure detecting pattern of FIG. 9.

In FIG. 10, there is illustrated in detail the exposure monitor pattern 801. Each of the variable intensity patterns 803 and 804 forms a continuous distribution of focus-independent image intensities from zero to unity on a surface of a wafer (a semiconductor substrate to be exposed) by setting the pitch P (on wafer) to 0.22 μm below the resolution limit to conform to exposure equipment used (wavelength=248 nm, NA=0.6, σ=0.75) and arranging light transmissive portions and light blocking portions in each intensity variable pattern with a duty ratio such that the light transmissive portions are incremented in width by 6.25 nm.

Figure 11:
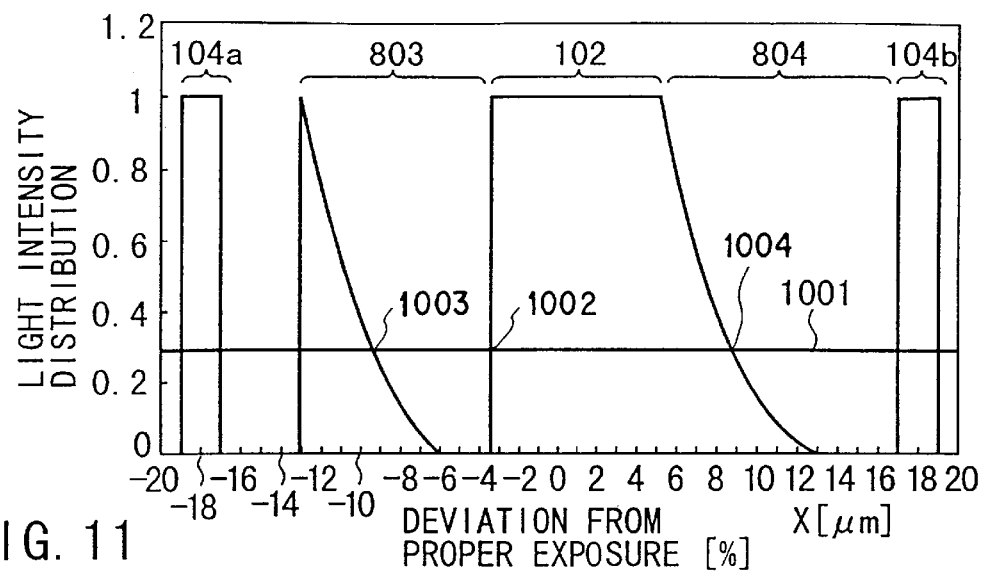
FIG. 11 shows the light intensity distribution at the A–A' portion of the exposure monitor pattern shown in FIG. 9.

FIG. 11 shows a light intensity distribution on a portion corresponding to the A–A' portion of the exposure detecting pattern 800. Normally, the exposure is adjusted to a minimum-rule pattern having the smallest margin. For example, when a 0.15 μm-rule pattern is transferred with a KrF exposure system, the light intensity corresponding to the proper exposure value (the edge light intensity indicated at 1001 in FIG. 11) is of the order of 0.2 to 0.3.

Figure 12:
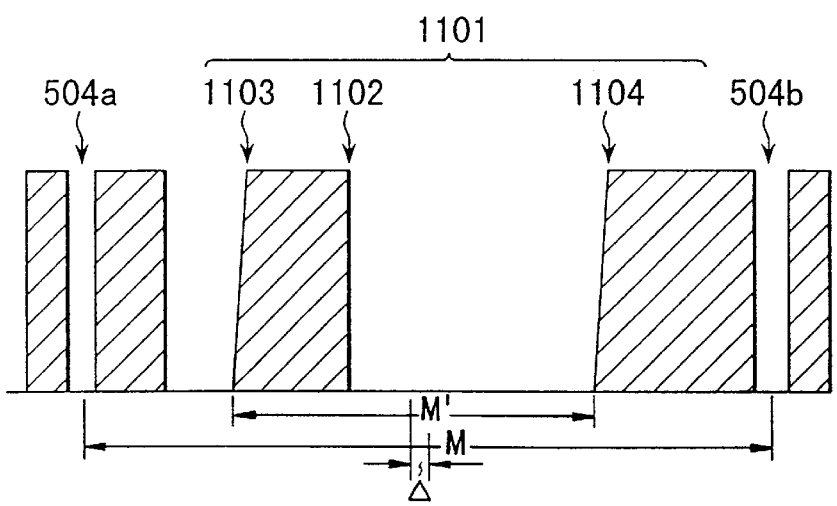
FIG. 12 shows a sectional view of a resist along the A–A' portion of exposure detecting pattern shown in FIG. 9.

FIG. 12 shows the profile of the resultant resist patterns corresponding to the A–A' portion of the exposure detecting pattern 800. In this figure, the reference numeral 1101 denotes exposure monitor marks formed to correspond to the exposure monitor patterns 801. The reference numerals 1102, 1103 and 1104 indicate resist pattern edges formed to correspond to intensity variable pattern 803, aperture pattern 102, and intensity variable pattern 804, respectively, and 504a and 504b indicate relative position detecting marks formed to correspond to relative position detecting patterns 104a and 104b, respectively. The location where each of the resist pattern edges 1103 and 1104 is formed varies with the intensity of exposing light, respectively as in the case of the edge 503 in FIG. 6.

In the case of the second embodiment shown in FIGS. 11 and 12, the midpoint M' should be obtained between the resist pattern edges 1103 and 1104 as shown in FIG. 12. The resist pattern edges 1103 and 1104 defined by the cross points 1003 and 1004 between the edge light intensity line 1001 and the variable intensity pattern curves 803 and 804 shift as the edge light intensity line 1001 moves up and down.

The midpoint M is obtained between the relative position detecting marks 504a and 504b.

In order to calculate the displacement Δ between the midpoints M and M' shown in FIG. 12, the two resist pattern edges 1103 and 1104 should be detected by a misalignment overlay inspection equipment. However, a normal misalignment overlay inspection equipment may detect the two resist pattern edges 1102 and 1104 instead of resist pattern edges 1103 and 1104. Therefore, a misalignment overlay inspection equipment having a function capable of detecting the resist pattern edges 1103 and 1104 should be used. In the second embodiment, the variable intensity patterns 803 and 804 have the same pattern arrangement as shown in FIG. 10 in which the widths of the light transmission portions of the patterns 803 and 804 increase from left to right in the figure.

Figure 13:
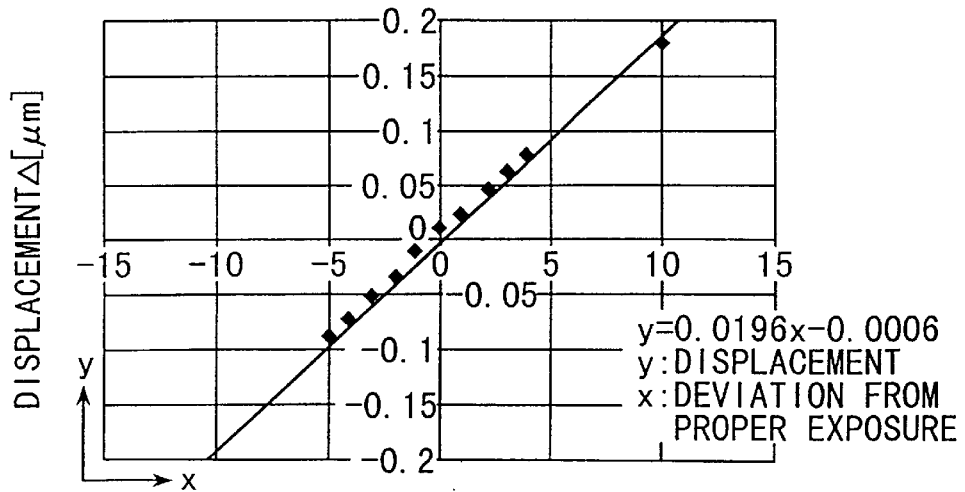
FIG. 13 shows a calibration curve obtained by using the exposure detecting pattern of FIG. 9.

As a result, according to the second embodiment, deviations from proper exposures become able to be detected not only as the shift of the resist pattern edge 1103 but also the shift of the resist edge pattern 1104, improving the detection sensitivity in comparison with the first embodiment. FIG. 13 shows a plot (calibration curve) of relative position displacement versus deviation from proper exposure obtained through the use of the exposure detecting pattern 800 of FIG. 9. From the calibration curve shown in FIG. 13, the following relationship is obtained between the accuracy Sd of deviations from proper exposures and the accuracy Sp of detection of relative position displacement Δ:

$$Sd[\%]=51\times Sp[\mu m] \quad (5)$$

Misalignment overlay inspection equipment used at this time has an accuracy of 5 nm (0.005 μm). An exposure monitor mask was therefore obtained which has an exposure detection sensitivity of the order of 0.25% (51×0.005=0.25) as obtained from equation (5) and permits variations in proper exposure to be monitored with the above accuracy.

As the variable intensity pattern, not only the pattern of FIG. 10 but also another pattern can be used in addition to the exposure detecting pattern which is not limited to that of FIG. 9. Use may be made of any other detect pattern that has marks that can be detected by the misalignment overlay inspection equipment. Merely making part of the marks enables a variable intensity pattern as described above to offer the same advantages as above.

Further, as shown in FIG. 14A, a pair of relative position detecting patterns 1304a and 1304b provided on both sides of the exposure monitor pattern 801 may be made as variable intensity patterns as shown in FIGS. 14B and 14D. As shown in FIGS. 14B to 14D, the widths of the light transmission portions of the relative position detecting patterns 1304a and 1304b are arranged to increase from left to right in the figure. While, the widths of the light transmission portions of the variable intensity patterns 803 and 804 are arranged to decrease from left to right in the figure as shown in FIG. 14B to 14D. The variable-width arrangement of the patterns 1304a and 1304b causes pattern edge displacements due to variations in proper exposure in the opposite direction to those in the variable intensity patterns 803 and 804 arranged in the exposure monitor pattern 801. Thus, the exposure detection of the pattern arrangement shown in FIG. 14A to 14D can be made at twice the sensitivity as that shown in FIG. 9.

The present invention is not limited to the above-described embodiments. For example, although, in the above embodiments, exposures are monitored based on positional displacements A in the x-axis direction of patterns, positional displacements in the y-axis direction may be detected instead by changing the direction in which the variable intensity patterns are arranged. In addition, the addition of patterns of a pitch below the resolution limit of an exposure system used to portions of the relative position detect patterns as variable intensity patterns will provide the same advantages.

In the above embodiments, the light transmissive and blocking patterns are arranged at a duty ratio such that the light transmissive patterns are incremented in width by 6.25 nm. For higher exposure monitor sensitivities, it is effective to make great a change in the resist pattern edge position due to a variation in exposure by changing gently the duty ratio of light transmissive and blocking patterns in that area in the variable intensity pattern which corresponds to the proper exposure value (edge light intensity) and thereby forming a gentle distribution of image intensities.

[Third Embodiment]

A third embodiment of the present invention is arranged such that variations in proper exposure are monitored in advance using the exposure monitor mask of the first embodiment and, in transferring an object device pattern onto wafers, the variations are fed back to an exposure preset value to obtain proper exposures.

Reference is made to a flowchart shown in FIG. 15 as well as the images of patterns transferred to wafers shown in FIGS. 16A and 16B to describe the third embodiment.

Here, use is made of an exposure monitor mask on which the exposure detecting pattern 100 shown in FIG. 1 and the calibration pattern 200 shown in FIG. 2 are formed.

First, as shown in FIG. 16A, a plurality of patterns of the exposure monitor mask are transferred in sequence onto areas of a resist film deposited on the entire surface of a first wafer (dummy wafer) of a plurality of wafers under a given exposure setting or condition (step S21). At this point, such a light intensity distribution as shown in FIG. 5 is obtained on that portion of the resist in each exposed area (shot) which corresponds to the A–A' portion of the exposure detecting pattern 100. In FIG. 5, 104a, 102, 103 and 104b indicate the positions of the corresponding patterns formed on the mask. Further, in FIG. 5, 402 indicates the point at which the intensity of exposing light transmitted through the aperture pattern 102 agrees with the proper exposure value 400 and 403 indicates the point at which the intensity of exposing light transmitted through the variable intensity pattern 103 agrees with the proper exposure value denoted by the reference numeral 400.

After exposure, the resist is developed as shown in FIG. 6, so that the resist pattern corresponding to the exposure detecting pattern is formed on the wafer (step S22). Thus, FIG. 6 shows the profile of the resultant resist patterns corresponding to the A–A' portion of the mask shown in FIG. 1. In FIG. 6, 501 denotes an exposure monitor mark formed to correspond to the exposure monitor pattern 101, 502 and 503 denote edge formation positions formed to correspond to the aperture pattern 102 and the variable intensity pattern 103, respectively, and 504a and 504b denote relative position detect marks formed to correspond to the relative position detect patterns 104a and 104b.

Next, in each exposed area corresponding to each shot, the position M of the point midway between the two relative position detect marks 504a and 504b and the position M' of the point midway between the two edges 502 and 503 of the exposure monitor mark 501 that are opposed to each other in the x-axis direction are measured (step S23). The displacement Δ of the relative position of the two midpoints M and M', i.e., the difference in x-axis direction position between the two midpoints, is determined (step S24).

Figure 17:
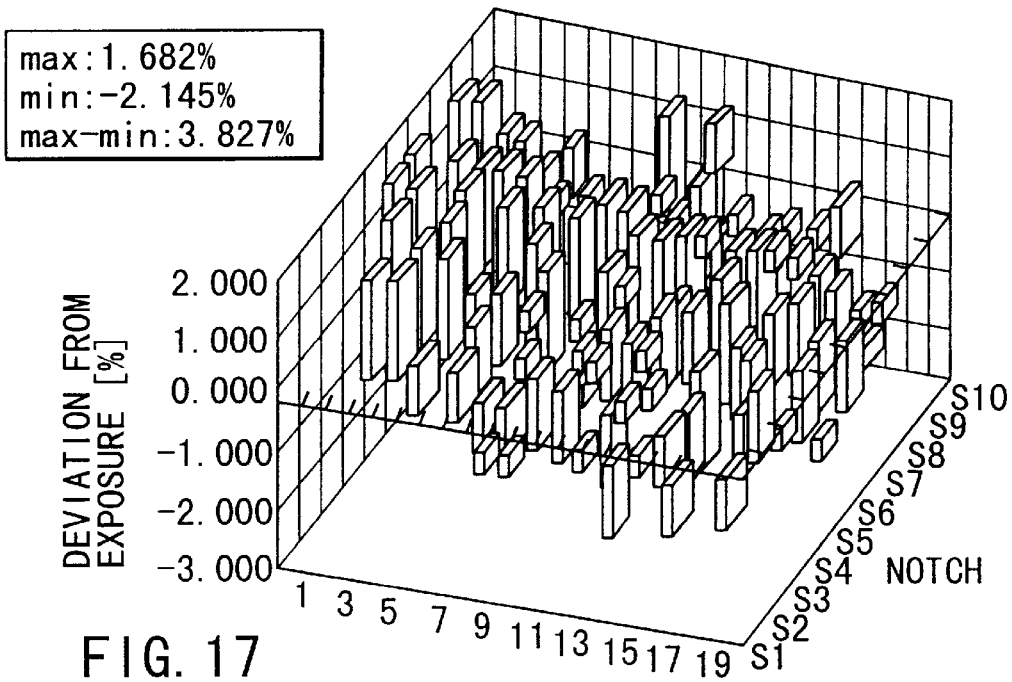
FIG. 17 shows the distribution of variations in proper exposure value determined from the calibration curve shown in FIG. 7.
Figure 19:
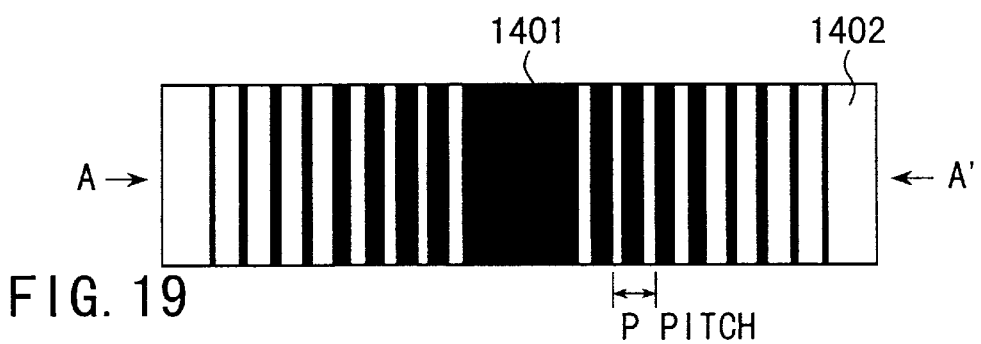
FIG. 19 is a plan view of an exposure monitor pattern formed in a conventional monitor mask.
Figure 20:
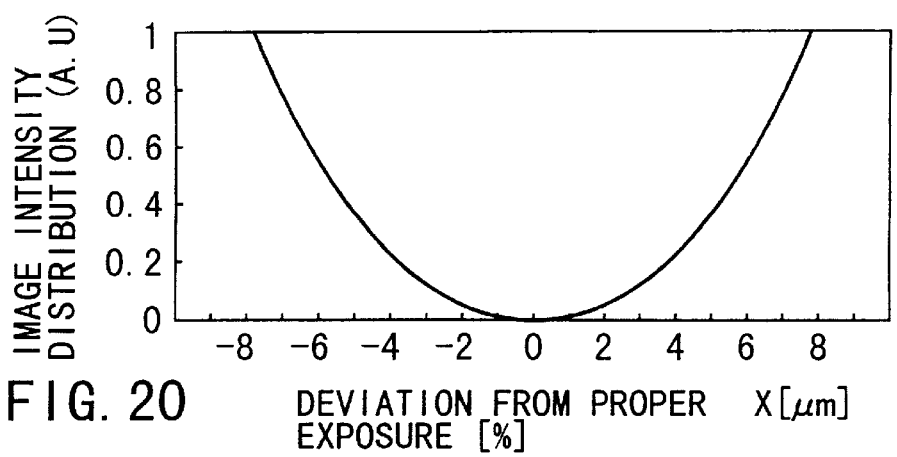
FIG. 20 shows the image intensity distribution along the A–A' line of the pattern portion obtained when the monitor pattern shown in FIG. 19 is transferred.

From the previously determined calibration curve of relative position displacement versus deviation from proper exposure shown in FIG. 7, a deviation ϵi from proper exposure for each shot is determined as shown in FIG. 16B (step S25). FIG. 17 shows a distribution of deviations from proper exposures over the entire surface of the wafer obtained from the calibration curve of FIG. 7 on the basis of the measurements of displacements of the exposure detecting pattern. In FIG. 17, each bar shows the deviations from the proper exposure and corresponds with a respective one of shots (exposed areas).

Next, each of resist-formed wafers other than the first dummy wafer is exposed in sequence to receive an image of an objective device pattern on a mask used for manufacture of ICs. In this exposure process, a correction is made on the exposure for each shot by a corresponding deviation from proper exposure in accordance with the distribution of deviations from proper exposures over the entire surface of the dummy wafer shown in FIG. 16B (step S26).

Thus, each shot is made under best exposure. As a result, variations in proper exposure resulting from irregularities in the thickness of the resist and antireflection film on wafer and unevenness of temperature in the baker can be monitored and corrected based on displacements of the exposure detecting pattern. Exposure can be made all the time with a maximum of exposure margin and a reduction in yield can be limited.

Although the described embodiments have been described as measuring the displacements of the exposure detect pattern using the misalignment overlay inspection equipment independent of the exposure system, it is also possible to use a misalignment overlay inspection function built into the exposure system itself. The exposure detect pattern is not limited to that shown in FIG. 1. Use may be made of any other pattern that has marks detectable by the misalignment overlay inspection equipment. Merely making part of the marks a monitor pattern as described above will offer the same advantages as above. For improved detection sensitivity, such an exposure detect pattern as shown in FIG. 9 or 14A may be used.

[Fourth Embodiment]

In the fourth embodiment, using a mask pattern in which the exposure monitor pattern of FIG. 1 is formed in an area other than an area in which an objective device pattern is formed, wafers in a first lot are exposed to the mask pattern at a predetermined proper exposure setting. After development, some of the wafers in the first lot are sampled and then deviations from the proper exposure are monitored for some shots in the sampled wafers. If the deviations are within a given torelance, then the subsequent lot of wafers is subjected to the exposure process without any change in exposure setting. Otherwise, the exposure setting is corrected accordingly for feedback to the subsequent lot using the formed exposure detecting pattern formed on the respective wafers in the first lot.

Here, use is made of a mask in which the exposure detecting pattern of FIG. 1 is formed in a mask area where a device pattern is not formed.

Figure 18:
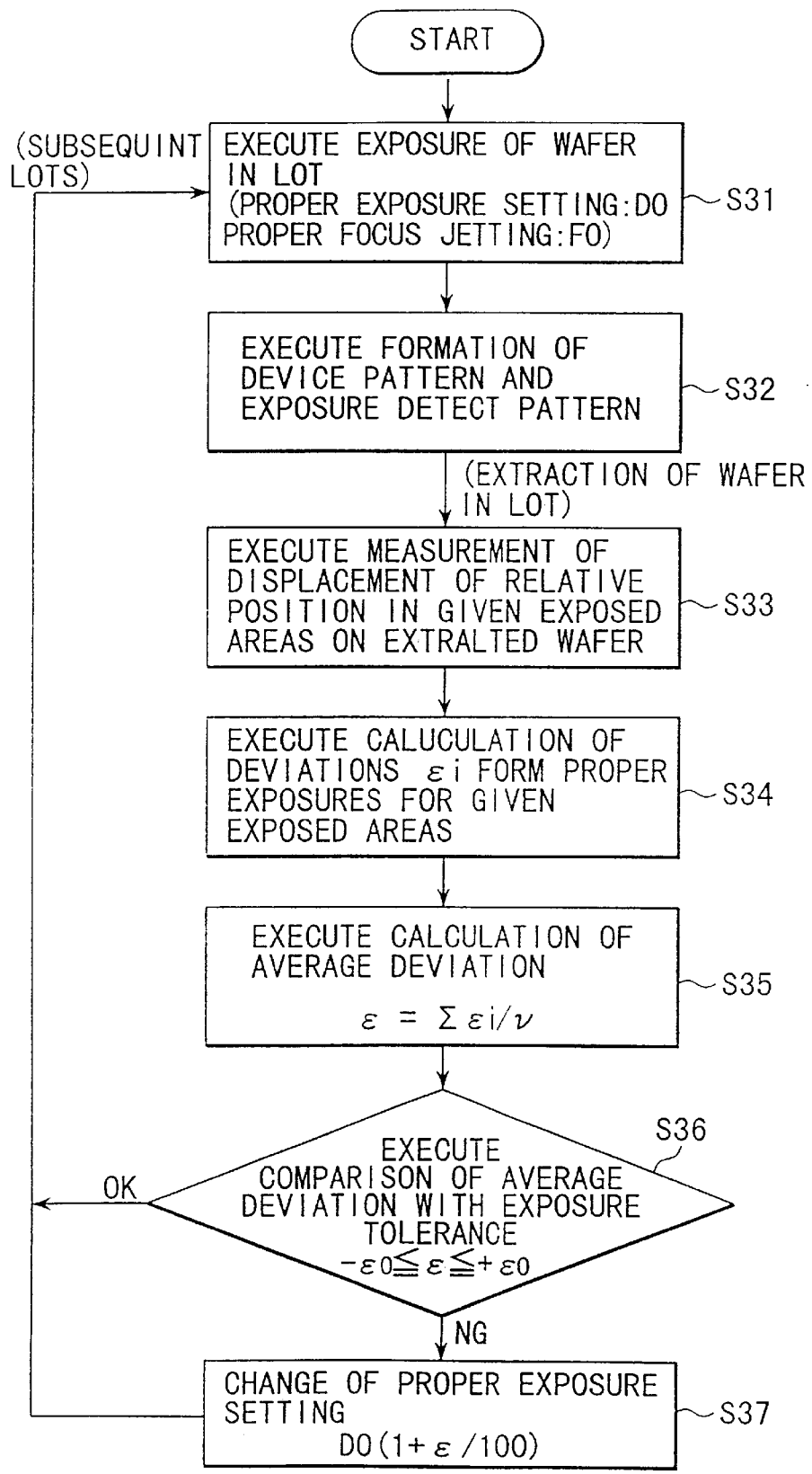
FIG. 18 is a flowchart for use in explanation of a semiconductor device manufacturing method according to a fourth embodiment of the present invention.

First, as shown in FIG. 18, a proper exposure Do and a proper focus value Fo are set and then the mask pattern is transferred to each of areas of the entire surface of each resist-formed wafer in the first lot under the same exposure conditions (step S31). Next, PEB (Post Exposure Bake) and development are performed to form the resist pattern including the device pattern and the exposure detecting pattern as shown in FIG. 6 (step S32). After that, one wafer is extracted or sampled from the lot and, using the misalignment overlay inspection equipment, a mark displacement Δ in the x-axis direction in each of shots in n predetermined shot positions, for example, a total of five shots including a center shot, shots to the right and left of and above and below the center shot, is detected (step S33). A deviation ϵi from proper exposure is then determined for each of the selected shots from such a calibration curve as shown in FIG. 7 (step S34). Next, the average deviation ϵ from proper exposure, $\epsilon = \Sigma \epsilon i/n$, is determined from deviations ϵi from proper exposure for the selected slots, which is considered as the effective deviation from proper exposure for the lot (step S35).

After that, the average deviation from proper exposure, ϵ, is compared with a predetermined torelance ϵo (step S36). If the effective deviation from proper exposure, ϵ, of the lot is within the torelance ϵo, then the next lot is subjected to exposure to the device pattern. Otherwise, the exposure setting Do is corrected by E for feedback to exposure of wafers in the subsequent lots (step S37).

Thus, each wafer in the subsequent lots is exposed under best exposure. As a result, variations in proper exposure resulting from irregularities in the thickness of the resist and antireflection film on the wafers, clouding of lenses in the exposure system, variations in conditions of underlying antireflection film, and so on can be monitored and corrected based on the displacement Δ of the exposure detecting pattern. According to the present embodiment, the exposure can be made all the time with a maximum of exposure margin and a reduction in yield can be limited.

Although, in the present embodiment, one wafer is extracted or sampled from a lot, and the effective deviation from proper exposure in that wafer is determined and considered as the effective average deviation from proper exposure for that lot, this is not restrictive. The present embodiment may be modified such that two or more wafers are sampled from a lot, the deviations from proper exposures in those wafers are averaged, and the average deviation is determined as the effective average deviation for that lot.

Although the embodiments have been described as measuring the displacement Δ in the exposure detecting pattern using the misalignment overlay inspection equipment independent of the exposure system, it is also possible to use a misalignment overlay inspection function built into the exposure system itself. The exposure detecting pattern is not limited to that of FIG. 1. Use may be made of any other pattern that has marks detectable by misalignment overlay inspection equipment. Merely making part of the marks a monitor pattern as described above will offer the same advantages as above. For improved detection sensitivity, such an exposure detecting pattern as shown in FIG. 9 or 14A may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure monitor mask comprising an exposure detecting pattern having at least three patterns arranged in one direction, wherein:

the exposure detecting pattern includes at least one variable intensity pattern which allows an intensity of exposing light transmitted therethrough to vary monotonously in said one direction; and the exposure monitor mask is allowed to be used with an exposing system in which the wavelength of exposing light is $\lambda$, the numerical aperture on the photosensitive substrate side is NA, and the coherent factor is $\sigma$, and the variable intensity pattern has a light transmissive portion and a light blocking portion for the exposing light, which are discretely or continuously arranged in said one direction at a pitch P which satisfies the following condition:

$$1/P \geq (1+\sigma)NA/\lambda.$$

2. An exposure monitor mask according to claim 1, wherein the exposure detecting pattern includes a pair of relative position detecting patterns arranged in the one direction, and the variable intensity pattern is interposed between the pair of relative position detecting patterns.

3. An exposure monitor mask according to claim 1, wherein the exposure detecting pattern includes a pair of relative position detecting patterns arranged in the one direction, and a plurality of variable intensity patterns are interposed in the one direction between the pair of relative position detecting patterns.

4. An exposure monitor mask according to claim 1, wherein the exposure detecting pattern includes a pair of relative position detecting patterns arranged in a direction perpendicular to the one direction with the variable intensity pattern interposed therebetween and having a point midway therebetween substantially in the same position as a point midway between those edges of an exposure monitor pattern corresponding to the variable intensity pattern, the edges being opposed to each other in the direction perpendicular to the one direction.

5. A method of exposure adjustment comprising the steps of:

exposing a resist formed on a surface of a substrate by using an exposure monitor mask comprising an exposure detecting pattern, thereby transferring the exposure detecting pattern on the resist, the exposure detecting pattern having at least three patterns arranged in one direction and at least one variable intensity pattern which allows the intensity of exposing light transmitted therethrough to vary monotonously in said one direction;

developing the resist to form marks on the resist, the marks corresponding to the exposure detecting pattern;

measuring the position of a midpoint M' between two edges of a mark corresponding to said at least one variable intensity pattern, which are located opposite to each other in said one direction, and the position of a midpoint M between two marks which have not yet been measured;

calculating a difference $\Delta$ in relative position between the midpoints M and M'; and adjusting an exposure amount in accordance with the difference $\Delta$, wherein the exposure monitor mask is allowed to be used with an exposing system in which the wavelength of exposing light is $\lambda$, the numerical aperture on the photosensitive substrate side is NA, and the coherent factor is $\sigma$, and the variable intensity pattern has a light transmissive portion and a light blocking portion for the exposing light, which are discretely or continuously arranged in said one direction at a pitch P which satisfies the following condition:

$$1/P \geq (1+\sigma)NA/\lambda.$$

6. An exposure adjustment method according to claim 5, wherein the exposure detecting pattern includes a pair of relative position detecting patterns arranged in the one direction and in which the variable intensity pattern is interposed between the pair of relative position detecting patterns.

7. An exposure adjustment method according to claim 5, wherein the exposure detecting pattern includes a pair of relative position detecting patterns arranged in the one direction, and a plurality of variable intensity patterns are interposed between the pair of relative position detecting patterns.

8. An exposure adjustment method according to claim 5, wherein the exposure detecting pattern includes a pair of relative position detecting patterns arranged in a direction perpendicular to the one direction with the variable intensity pattern interposed therebetween and having a point midway therebetween substantially in the same position as a point midway between those edges of the exposure monitor pattern which are opposed to each other in the direction perpendicular to the one direction.

9. A method of manufacturing semiconductor devices, comprising the steps of:

successively exposing all areas of a surface of a dummy wafer, on which a resist is formed, with respective shots of light at the same exposure condition by using an exposure monitor mask, thereby transferring the exposure monitor mask on the resist, the exposure monitor mask comprising an exposure detecting pattern which includes at least three patterns arranged in one direction and at least one variable intensity pattern which allows the intensity of exposing light transmitted therethrough to vary monotonously in said one direction;

developing the resist to form marks on the resist, the marks corresponding to the pattern of the exposure monitor mask;

measuring a difference in relative position between the marks for each of the exposed areas;

calculating an error in exposure for said each of the areas with reference to a proper exposure on the basis of results of measurement in the measuring step; and transferring a device pattern onto areas of a surface of another wafer by successively exposing the areas with respective shots of light each of which is applied at an exposure value obtained by correcting the error in exposure for a respective one of the areas, wherein the exposure monitor mask is allowed to be used with an exposing system in which the wavelength of exposing light is $\lambda$, the numerical aperture on the photosensitive substrate side is NA, and the coherent factor is $\sigma$, and the variable intensity pattern has a light transmissive portion and a light blocking portion for the exposing light, which are discretely or continuously arranged in said one direction at a pitch P which satisfies the following condition:

$$1/P \geq (1+\sigma)NA/\lambda.$$

10. A method according to claim 9, wherein the step of calculating a deviation from a proper exposure includes previously determining a relationship of mark displacement versus deviation from proper exposure from the results of exposure operations performed using the exposure monitor mask while changing exposure settings and calculating a deviation from a proper exposure from the said relationship.

11. A method according to claim 9, further comprising the step of calculating a distribution of deviations from a proper exposure over the entire surface of the wafer after the step of calculating a deviation from a proper exposure for each of exposed areas, and wherein the step of transferring a device pattern includes exposing each of areas on the another wafer at an exposure value obtained by correcting the given exposure setting in accordance with the distribution of deviations from the proper exposure.

12. A method according to claim 9, wherein the exposure detecting pattern includes a pair of relative position detecting patterns arranged in the one direction and in which the variable intensity pattern is interposed between the pair of relative position detecting patterns.

13. A method according to claim 9, wherein the exposure detecting pattern includes a pair of relative position detecting patterns arranged in the one direction, and a plurality of variable intensity patterns are interposed between the pair of relative position detecting patterns.

14. A method according to claim 9, wherein the exposure detecting pattern includes a pair of relative position detecting patterns arranged in a direction perpendicular to the one direction with the variable intensity pattern interposed therebetween and having a point midway therebetween substantially in the same position as a point midway between those edges of the exposure monitor pattern, the edges being opposed to each other in the direction perpendicular to the one direction.

15. A method of manufacturing semiconductor devices by using an exposure monitor mask comprising a variable intensity pattern which allows the intensity of exposing light transmitted therethrough to vary monotonously in said one direction, and opening patterns formed on both sides of the variable intensity pattern, the variable intensity pattern and the opening patterns being arranged in one direction, wherein the exposure monitor mask is allowed to be used with an exposing system in which the wavelength of exposing light is $\lambda$, the numerical aperture on the photosensitive substrate side is NA, and the coherent factor is $\sigma$, and the variable intensity pattern has a light transmissive portion and a light blocking portion for the exposing light, which are discretely or continuously arranged in said one direction at a pitch P which satisfies the following condition:

$$1/P \geq (1+\sigma)NA/\lambda.$$

* * * * *

UNITED STATES PATENT AND TRADEMARK OFFICE
CERTIFICATE OF CORRECTION

PATENT NO.    : 6,226,074 B1
DATED         : May 1, 2001
INVENTOR(S)   : Tadahito Fujisawa et al.

It is certified that error appears in the above-identified patent and that said Letters Patent is hereby corrected as shown below:

Column 13,
Lines 19 and 62, "monotonously" should read -- monotonically --.

Column 14,
Line 53, "monotonously" should read -- monotonically --.

Column 16,
Line 17, "monotonously" should read -- monotonically --.

Signed and Sealed this

Twenty-third Day of April, 2002

Attest:

JAMES E. ROGAN
*Attesting Officer*    *Director of the United States Patent and Trademark Office*